(12) United States Patent
Lee et al.

(10) Patent No.: US 6,504,170 B1
(45) Date of Patent: Jan. 7, 2003

(54) FIELD EFFECT TRANSISTORS, FIELD EMISSION APPARATUSES, AND A THIN FILM TRANSISTOR

(75) Inventors: J. Ung Lee, Cohoes, NY (US); John Lee, Meridian; Benham Moradi, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/678,468

(22) Filed: Oct. 2, 2000

Related U.S. Application Data

(62) Division of application No. 09/260,231, filed on Mar. 1, 1999.

(51) Int. Cl.[7] .......................... H01L 29/06; H01L 31/036
(52) U.S. Cl. .......................... 257/10; 257/347; 257/61; 257/66
(58) Field of Search .............................. 257/347, 40, 9, 257/61, 66, 10, 330, 331, 349; 438/142, 149, 151, 154; 313/497, 336

(56) References Cited

U.S. PATENT DOCUMENTS

| | | | |
|---|---|---|---|
| 4,988,638 A | | 1/1991 | Huang et al. ............... 438/154 |
| 5,210,472 A | | 5/1993 | Casper et al. ............... 315/349 |
| 5,229,331 A | | 7/1993 | Doan et al. .................... 438/20 |
| 5,372,973 A | | 12/1994 | Doan et al. .................... 216/11 |
| 5,482,870 A | * | 1/1996 | Inoue .......................... 437/21 |
| 5,710,478 A | * | 1/1998 | Kanemaru et al. .......... 313/336 |
| 6,020,683 A | * | 2/2000 | Cathey, Jr. et al. ......... 313/497 |
| 6,057,555 A | | 5/2000 | Reedy et al. .................... 257/9 |
| 6,249,327 B1 | * | 6/2001 | Murade et al. ............... 349/43 |

FOREIGN PATENT DOCUMENTS

| | | |
|---|---|---|
| JP | 57-85262 | 11/1980 |
| JP | 61-252667 | 11/1986 |
| JP | 2-143462 | 11/1988 |
| JP | 3-159250 | 7/1991 |
| JP | 3-194937 | 8/1991 |
| JP | 5-114734 | 5/1993 |

OTHER PUBLICATIONS

Polycrystalline Silicon Thin Film Transistor Incorporating a Semi–Insulating Field Plate for High Voltage Circuitry on Glass, F.J. Clough, E.M.S. Narayanan, Y. Chen, W. Eccleston, and W.I. Milne, *Appl. Phys. Lett.* 71—Oct. 6, 1997, pp. 2002–2004, 1997 American Institute of Physics.

Geometry Dependence of the Transport Parameters in Field Effect Transistors Made From Amorphous Silicon, S. Griep, *Mat. Res. Soc. Symp. Proc.* 149, pp. 283–288, 1989 Materials Research Society.

* cited by examiner

*Primary Examiner*—Douglas A. Wille
*Assistant Examiner*—Dilinh Nguyen
(74) *Attorney, Agent, or Firm*—Wells St. John P.S.

(57) ABSTRACT

The present invention includes field effect transistors, field emission apparatuses, thin film transistors, and methods of forming field effect transistors. According to one embodiment, a field effect transistor includes a semiconductive layer configured to form a channel region; a pair of spaced conductively doped semiconductive regions in electrical connection with the channel region of the semiconductive layer; a gate intermediate the semiconductive regions; and a gate dielectric layer intermediate the semiconductive layer and the gate, the gate dielectric layer being configured to align the gate with the channel region of the semiconductive layer. In one aspect, chemical-mechanical polishing self-aligns the gate with the channel region. According to another aspect, a field emission device, includes a transistor configured to control the emission of electrons from an emitter.

12 Claims, 8 Drawing Sheets

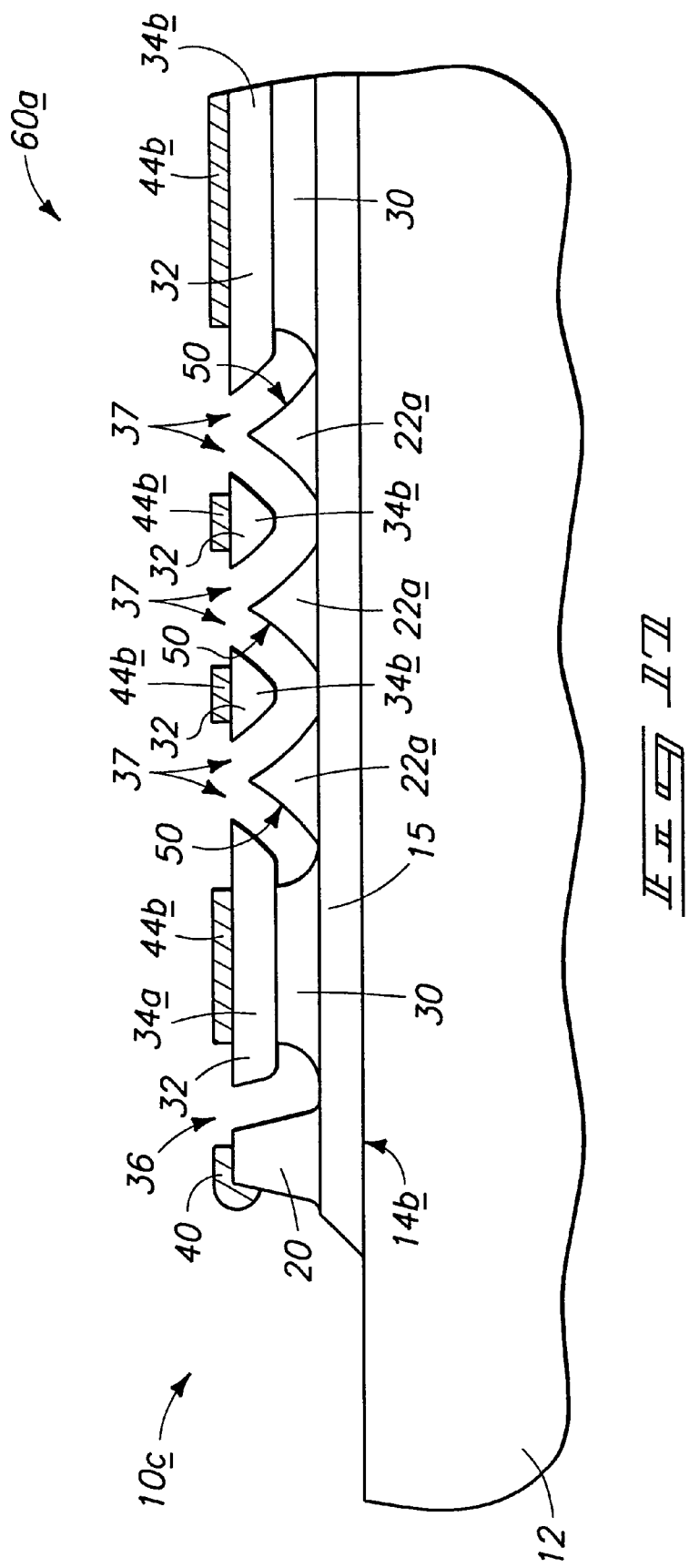

FIELD EFFECT TRANSISTORS, FIELD EMISSION APPARATUSES, AND A THIN FILM TRANSISTOR

RELATED PATENT DATA

This patent resulted from a divisional application of U.S. patent application Ser. No. 09/260,231, filed Mar. 1, 1999, entitled "Field Effect Transistors, Field Emission Apparatuses, Thin Film. Transistors, and Methods of Forming Field Effect Transistors", naming Ji Ung Lee et al. as inventors, the disclosure of which is incorporated by reference.

TECHNICAL FIELD

The present invention relates to field effect transistors, field emission apparatuses, thin film transistors, and methods of forming field effect transistors.

BACKGROUND OF THE INVENTION

Field effect transistors are well known in the art. Such transistors are utilized in a variety of applications. One exemplary field effect transistor configuration is the thin film transistor. Thin film transistor configurations have been particularly useful in field emission devices, such as field emission displays.

In typical arrangements, thin film field effect transistors are formed over an insulative substrate, such as glass. A thin film semiconductive layer is formed over the insulative substrate. An exemplary semiconductive layer comprises amorphous silicon. A gate dielectric layer and gate layer are provided over the thin film layer and patterned using photolithography to form a gate. Conductive regions are formed intrinsically using plasma enhanced chemical vapor deposition (PECVD) with appropriate gas precursors to form the thin film field effect transistor construction.

Precise alignment of the gate with the active region of a field effect transistor, including thin film transistor configurations, is desired to ensure proper operation of the device as well as enhance the operational characteristics of the device. There exists a need in the art to provide improved field effect transistor device configurations and methodologies for fabricating such transistor devices for controlling emission.

SUMMARY OF THE INVENTION

The present invention provides field effect transistors, field emission apparatuses, thin film transistors, and methods of forming field is effect transistors.

According to one aspect of the present invention a field effect transistor includes a semiconductive layer configured to form a channel region. The field effect transistor further includes a pair of spaced conductively doped regions in electrical connection with the channel region of the semiconductive layer and a gate intermediate the semiconductive regions. A gate dielectric layer is provided intermediate the semiconductive layer and the gate, and the gate dielectric layer is configured to align the gate with the channel region of the semiconductive layer.

According to some aspects of the present invention, the conductive regions comprise source/drain regions. One of the source/drain regions may be formed to comprise a field emitter providing a field emission apparatus. The field emission apparatus is configured as an active field device in some configurations.

In one aspect, chemical-mechanical polishing self-aligns the gate with the channel region. According to another aspect, a field emission device includes a transistor configured to control the emission of electrons from an emitter.

Yet another aspect of the present invention provides a method of forming a field effect transistor. The method includes the steps of forming a semiconductive layer having a channel region and forming plural spaced conductively doped regions electrically coupled with the semiconductive layer. This method further provides forming a gate dielectric layer over the semiconductive layer, forming a gate over the gate dielectric layer, and aligning the gate with the channel region using the gate dielectric layer.

Other aspects of the present invention are disclosed herein.

BRIEF DESCRIPTION OF THE DRAWINGS

Preferred embodiments of the invention are described below with reference to the following accompanying drawings.

FIG. 17 is a cross-sectional view of a segment of an alternative field emission device.

DETAILED DESCRIPTION OF THE PREFERRED EMBODIMENTS

This disclosure of the invention is submitted in furtherance of the constitutional purposes of the U.S. Patent Laws "to promote the. progress of science and useful arts" (Article 1, Section 8).

The present invention discloses transistors and methods of forming transistors. An exemplary transistor of the present invention includes a thin film transistor (TFT) having a semiconductor-on-insulator (SOI) construction. One fabrication method of the present invention for forming a first thin film field effect transistor configuration is described herein with reference to FIG. 1–FIG. 11. A second thin film field effect transistor configuration according to the present invention is depicted in FIG. 12. Fabrication of another thin film field effect transistor arrangement including a field emitter is described herein with reference to FIG. 13–FIG. 16. The configuration depicted in FIG. 16 comprises an active switching field emission device. Although the present invention is described with reference to thin film field effect transistors, the invention is not to be limited to such disclosed configurations.

Figure 1:
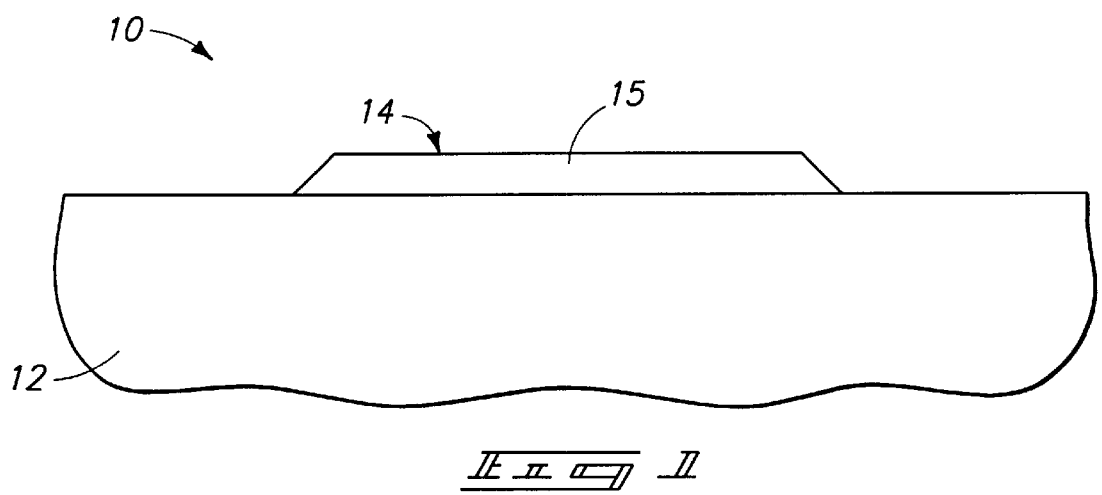
FIG. 1 is a cross-sectional view of a segment of a thin film field effect transistor at a preliminary processing step.
Figure 2:
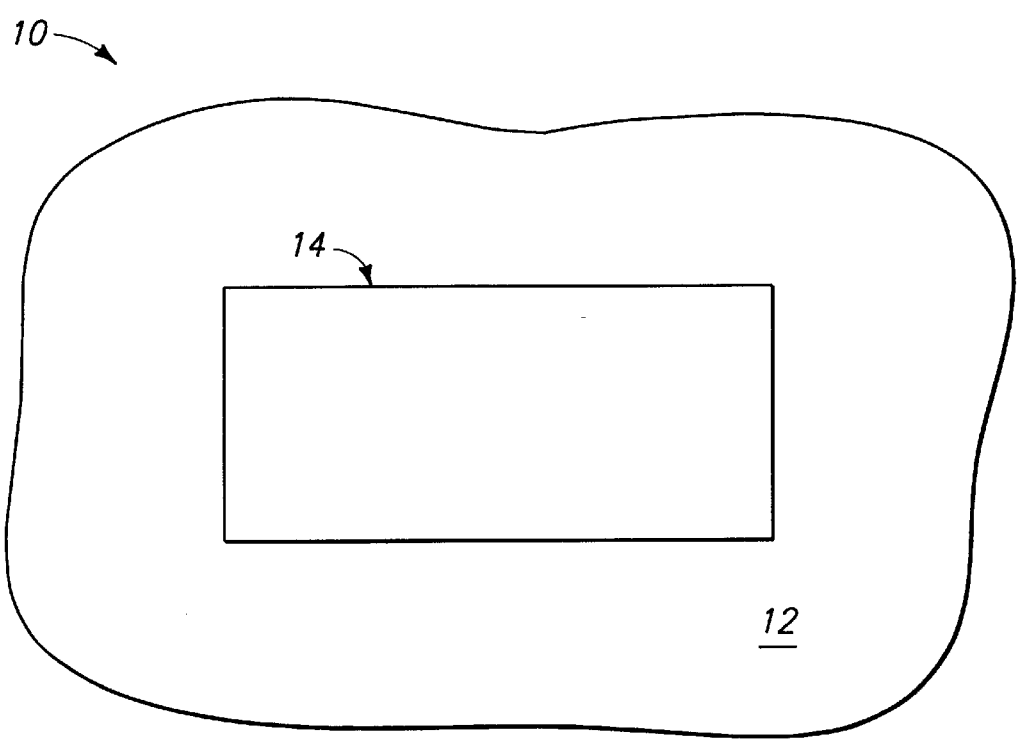
FIG. 2 is a plan view of the segment shown in FIG. 1.

Referring to FIG. 1 and FIG. 2, a segment or fragment 10 of a thin film. field effect transistor is illustrated. Segment 10 includes an insulative substrate 12 and. a semiconductive layer 14 formed over insulative substrate 12. Exemplary materials for insulative substrate 12 include glass, sapphire or silicon oxide. Semiconductive layer 14 is preferably formed as a thin film semiconductive layer having an approximate height or thickness of 0.2–0.5 microns. Thin film semiconductive layer 14 comprises amorphous silicon according to the described embodiment although other materials may be utilized, such as SiC, CdSe, polycrystalline Si, microcrystalline Si, etc.

Thin film semiconductive layer 14 is ideally doped to provide increased conductivity. In one embodiment, thin film semiconductive layer 14 is doped with a p-type impurity using intrinsic doping. As described below, thin film conductive layer 14 is configured to form a channel region 15 of a field effect transistor to selectively conduct electrons between adjacent semiconductive regions (shown in FIG. 5). Accordingly, at least a portion of layer 14 is provided intermediate the subsequently formed semiconductive regions.

Formation of thin film semiconductive layer 14 comprises providing a semiconductive layer over an upper surface of insulative substrate 12, and subsequently patterning the layer to provide the configuration illustrated in FIG. 1. Conventional photolithography techniques are used in one embodiment to pattern the thin film semiconductive layer. As shown in FIG. 2, the patterned thin film semiconductive layer 14 forms a substantially rectangular shape in the presently described thin film field effect transistor configuration.

Figure 3:
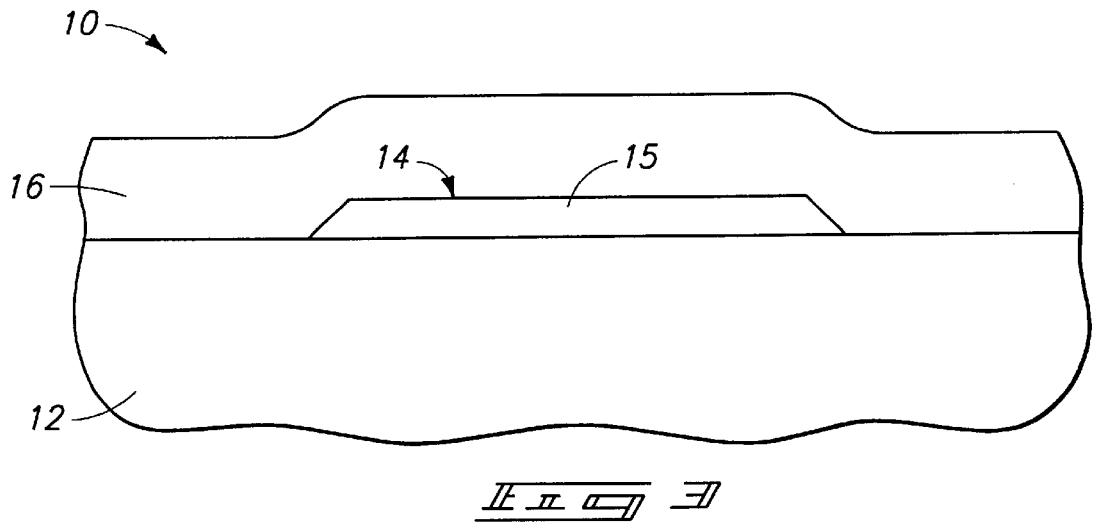
FIG. 3 is a cross-sectional view of the segment shown in FIG. 1 at a subsequent processing step.

Referring to FIG. 3, a semiconductive layer 16 is formed over insulative substrate 12 and patterned thin film semiconductive layer 14. Semiconductive layer 16 has an exemplary height or thickness of approximately 1–3 microns and is preferably doped to provide increased conductivity. In the described embodiment, semiconductive layer 16 is preferably doped with an n+ type dopant to provide enhanced conductivity. Intrinsic doping using appropriate precursor gases are utilized in the described embodiment to dope layer 16.

Figure 4:
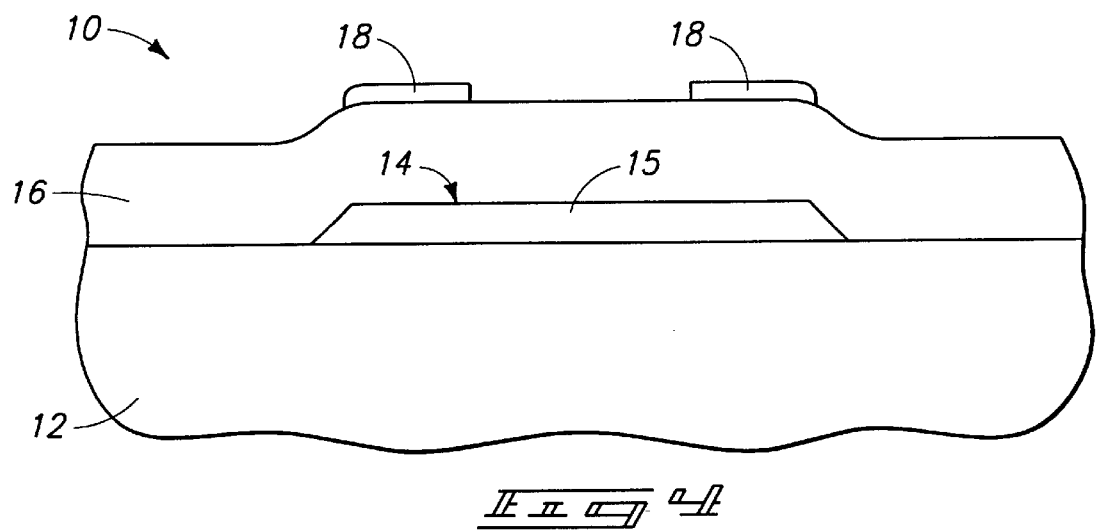
FIG. 4 is a cross-sectional view of the segment shown in FIG. 3 at a subsequent processing step.

Referring to FIG. 4, a patterned mask 18 is provided over semiconductive layer 16. Mask 18 permits subsequent processing of segment 10 in accordance with the present invention. In an exemplary embodiment, mask 18 comprises positive photoresist formed by photolithography. Individual portions of mask 18 individually have a length of approximately 10 microns.

Figure 5:
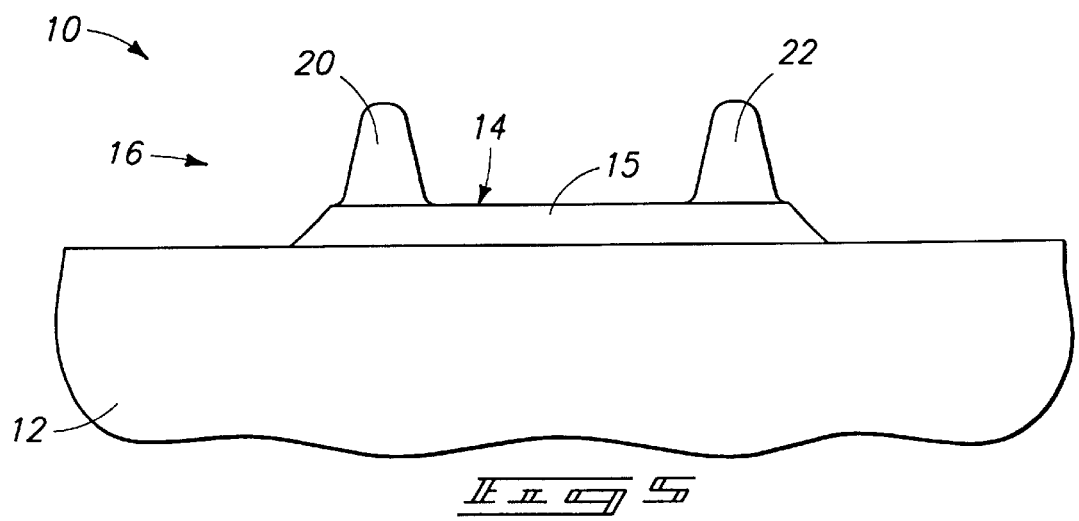
FIG. 5 is a cross-sectional view of the segment shown in FIG. 4 at a subsequent processing step.
Figure 6:
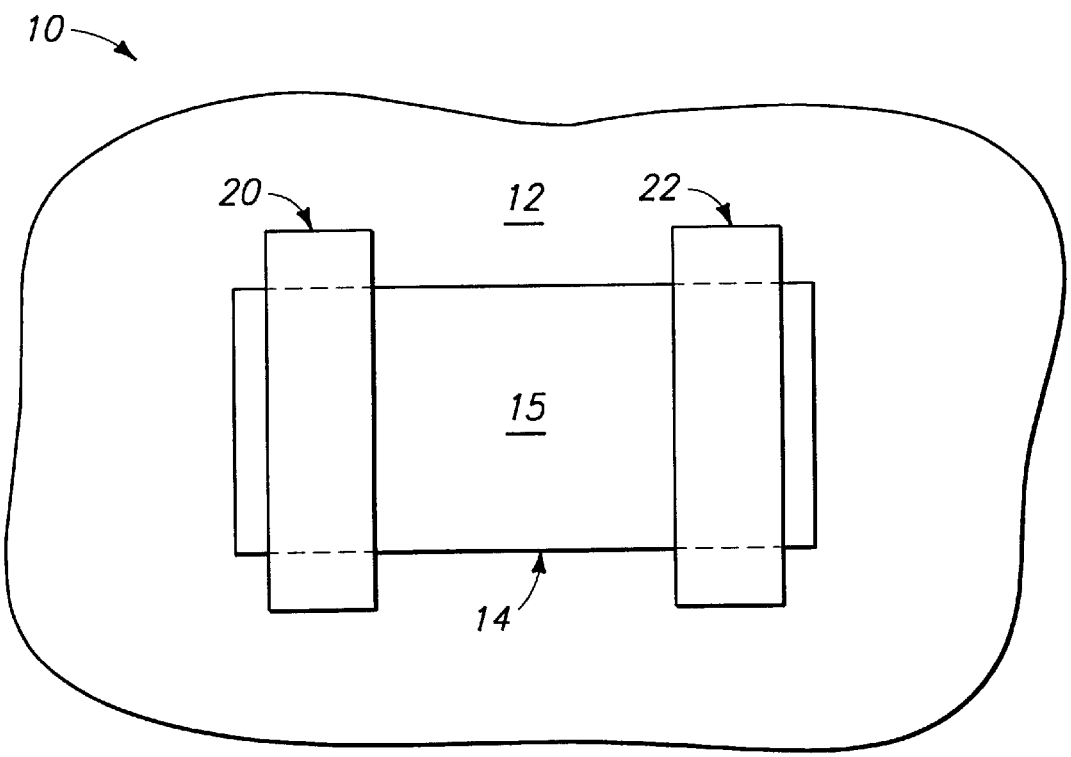
FIG. 6 is a plan view of the segment shown in FIG. 5.

Referring to FIG. 5 and FIG. 6, portions of semiconductive layer 16 have been removed providing plural semiconductive regions 20, 22. Semiconductive regions 20, 22 correspond to mask 18 and may be formed by etching exposed portions of semiconductive layer 16. A largely isotropic silicon wet etch or plasma dry etch is utilized in one embodiment to etch layer 16 and form regions 20, 22.

As illustrated, semiconductive regions 20, 22 are formed over and in electrical connection with thin film semiconductive layer 14 and channel region 15 thereof. Channel region 15 generally extends intermediate semiconductive regions 20, 22. Semiconductive regions 20, 22 preferably comprise spaced conductively doped n+ regions. In the presently described embodiment, semiconductive regions 20, 22 are formed as mesas.

Semiconductive regions 20, 22 comprise source/drain regions of a field effect transistor. In typical applications, semiconductive regions 20, 22 comprise a source region and drain region, respectively.

Figure 7:
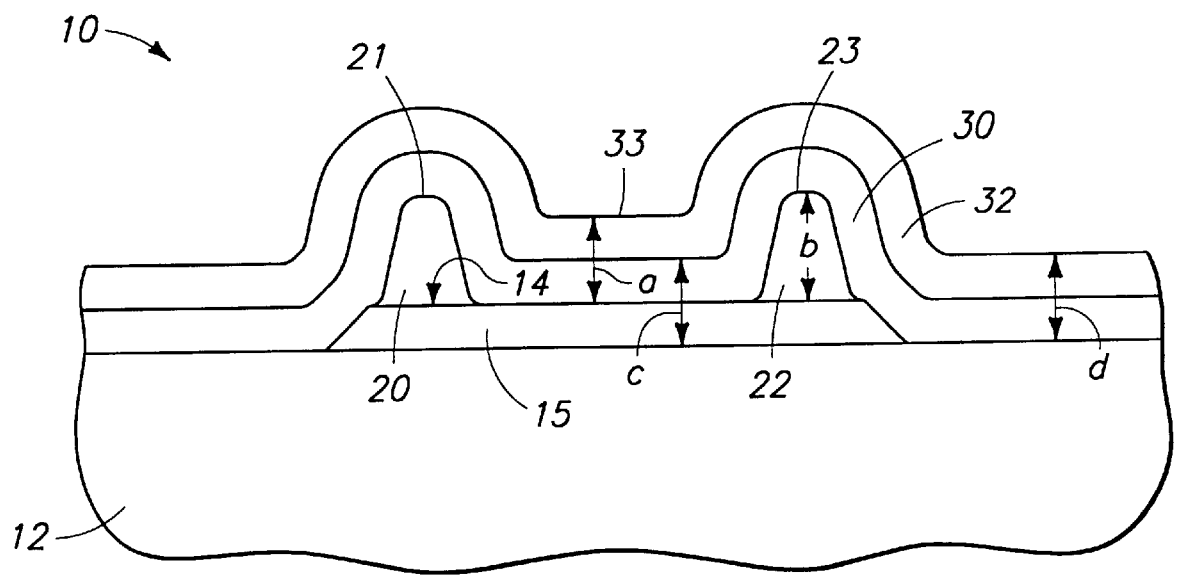
FIG. 7 is a cross-sectional view of the segment shown in FIG. 5 at a subsequent processing step.

Referring to FIG. 7, a gate dielectric layer 30 and gate layer 32 are formed over substrate 12, semiconductive layer 14, and semiconductive source/drain regions 20, 22. Exemplary materials for layers 30, 32 include silicon oxide and conductively doped polysilicon, respectively. In the described embodiment, gate layer 32 is doped with an n+ dopant using plasma enhanced chemical vapor deposition (PECVD) techniques. Gate dielectric layer 30 has an exemplary height within the range of approximately 0.1–0.4 microns, and gate layer 32 has an exemplary thickness of approximately 0.2–0.5 microns. Preferably, gate dielectric layer 30 has a uniform thickness.

In the illustrated embodiment, layers 30, 32 are provided with a combined thickness "a" which does not exceed the individual heights "b" of semiconductive regions 20, 22. More specifically, semiconductive regions 20, 22 comprise respective upper outermost surfaces 21, 23. Layer 32 includes an upper outermost surface 33 above channel region 15. As referred to herein, upper outermost surfaces refer to surfaces away from or opposite insulative substrate 12 and thin film semiconductive layer 14. Surfaces 21, 23 are provided elevationally higher than surface 33 in the described embodiment. Surfaces 21, 23 may be elevationally coincident or below surface 33 in other embodiments.

According to the preferred embodiment, channel region 15 has a thickness less than the thickness of layer 32. Accordingly, the height of region 15 and layer 30 have a combined thickness "c" less than a combined thickness "d" comprising layer 30 and layer 32.

Figure 8:
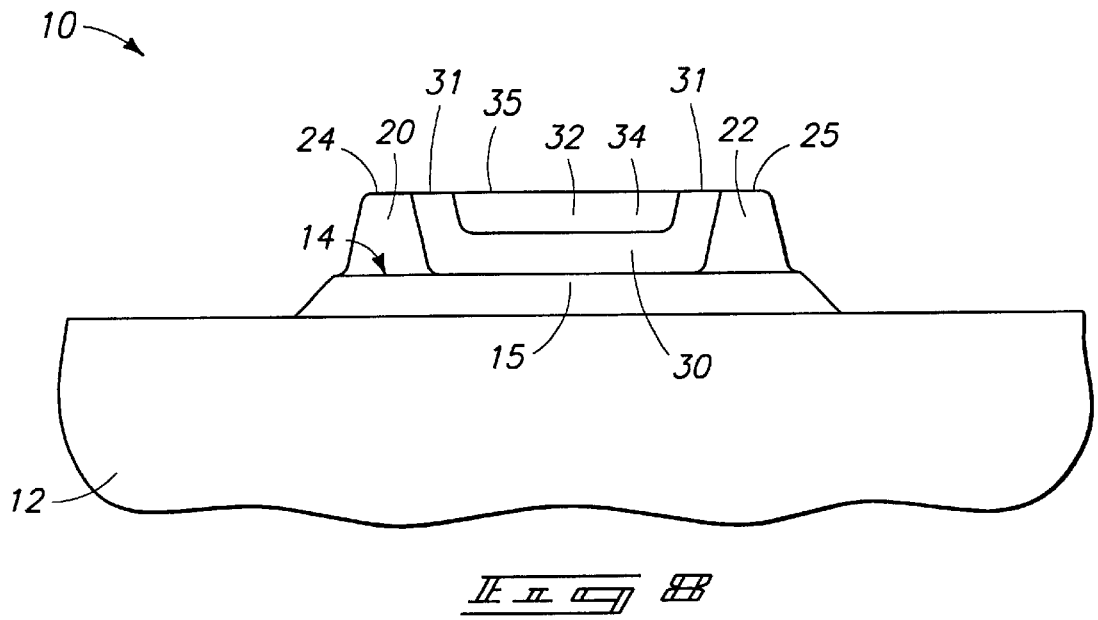
FIG. 8 is a cross-sectional view of the segment shown in FIG. 7 at a subsequent processing step.
Figure 9:
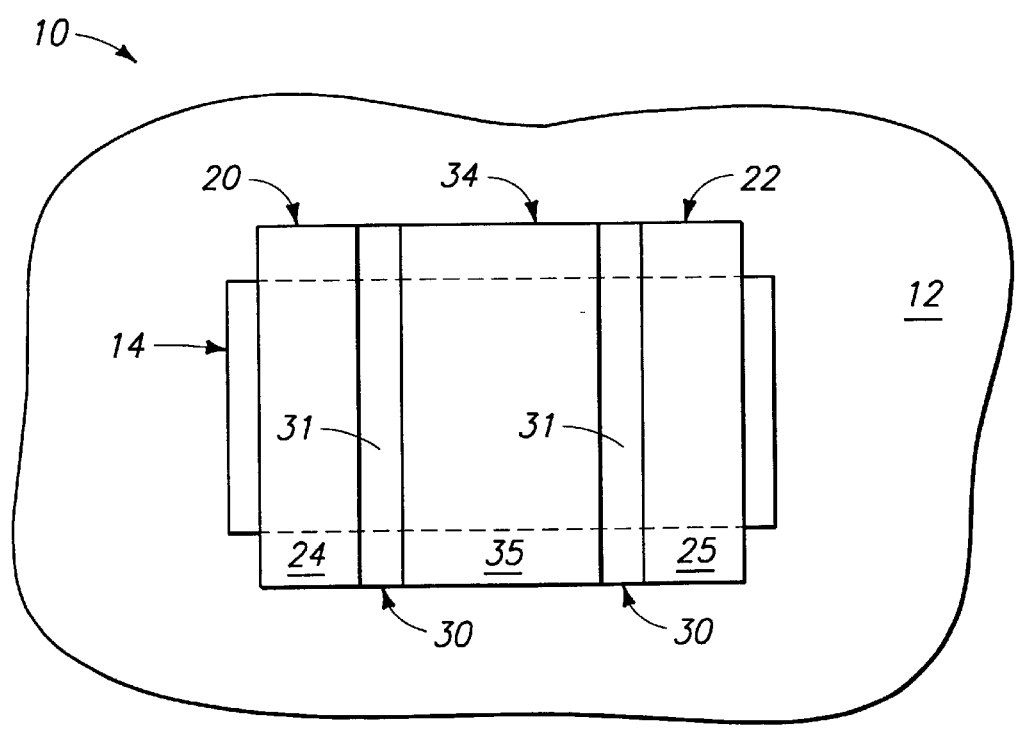
FIG. 9 is a plan view of the segment shown in FIG. 8.

Referring to FIG. 8 and FIG. 9, portions of gate dielectric layer 30, gate layer 32 and semiconductive regions 20, 22 have been removed. According to the described fabrication method, segment to is polished to remove portions of regions 20, 22 and layers 30, 32. The polishing comprises chemical-mechanical polishing according to the preferred embodiment. Respective uppermost surfaces or portions of semiconductive regions 20, 22 are removed before removing any portions of gate dielectric layer 30 formed above a subsequently formed gate (having reference, numeral 34 in FIG. 8). Polishing of segment 10 comprises initially polishing respective uppermost surfaces 21, 23 of source/drain regions 20, 22 before polishing any portions of gate layer 32 comprising surface 33 (surfaces 21, 23 and 33 are shown in FIG. 7) above thin film channel region 15. Surface 33 of gate layer 32 tends to act as a stopping position during polishing of fragment 10.

A timed etch is used in an alternative fabrication method to remove portions of gate dielectric layer 30, gate layer 32 and semiconductive regions 20, 22.

The processing step shown in FIG. 8 provides an isolated gate 34 intermediate semiconductive source/drain regions 20, 22. Gate 34 is formed over and operatively proximate channel region 15. More specifically, gate 34 is configured to control current flow intermediate semiconductive regions 20, 22 through channel region 15.

The described processing method for forming gate 34 includes removal of portions of gate dielectric layer 30, gate layer 32 and semiconductive regions 20, 22 in a common processing step. Preferably, gate 34 is formed without the use of a mask over gate material which subsequently forms gate 34. In particular, portions of both gate dielectric layer 30 and gate material layer 32 are removed using polishing or etching techniques as previously described without using a mask over the gate material which forms gate 34.

Utilization of the described and preferred fabrication method provides a gate 34 which self-aligns with channel region 15, and accomplishes such without any photomasking. Provision of gate dielectric layer 30 having a uniform thickness over thin film semiconductive layer 14, and subsequent removal of portions of gate dielectric layer 30 and gate layer 32 operate to form and align gate 34 with channel region 15. The preferred uniform thickness of gate dielectric layer 30 spaces gate 34 equally from semiconductive regions 20, 22 and aligns gate 34 with channel region 15.

Still referring to FIG. 8, gate 34 has an upper outermost surface 35 and semiconductive regions 20, 22 have respective upper outermost surfaces 24, 25. In some instances, surface 35 comprises the same surface of gate layer 32 depicted with reference numeral 33 in FIG. 7. Alternately, some polishing into layer 32 through surface 33 occurs.

Surfaces 24, 25 are elevationally lower than surfaces 21, 23 shown in FIG. 7 due to polishing of segment 10 according to the described fabrication method. Gate dielectric layer 30 includes upper outermost surfaces 31 following polishing of segment 10. As illustrated, gate upper outermost surface 35 is substantially elevationally coincident with gate dielectric layer upper outermost surfaces 31 and surfaces 24, 25 of respective semiconductive regions 20, 22.

Although such step is not depicted, portions of gate dielectric layer 30 and gate layer 32 located laterally outside of semiconductive regions 20, 22 are preferably removed following the polishing of segment 10 as shown in FIG. 8. A mask is formed over and intermediate semiconductive regions 20, 22 according to one processing method of removing such external material of layers 30, 32. Thereafter, the external portions of layers 30, 32 are etched or otherwise removed to provide the structure shown in FIG. 8.

Figure 10:
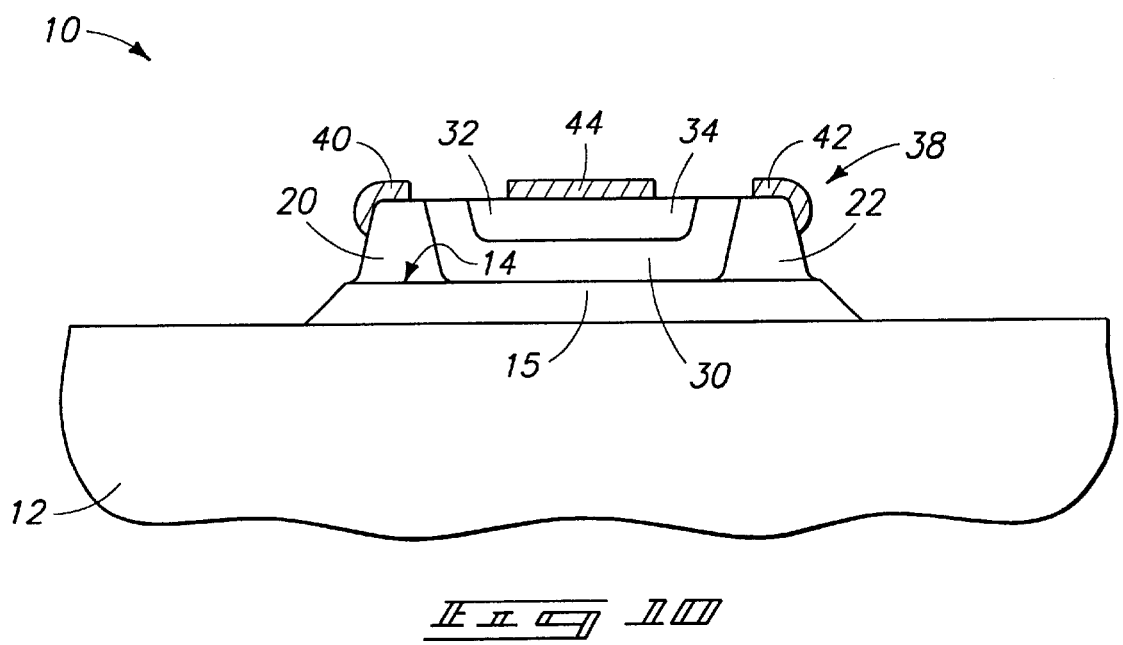
FIG. 10 is a cross-sectional view of the segment comprising a thin film field effect transistor.
Figure 11:
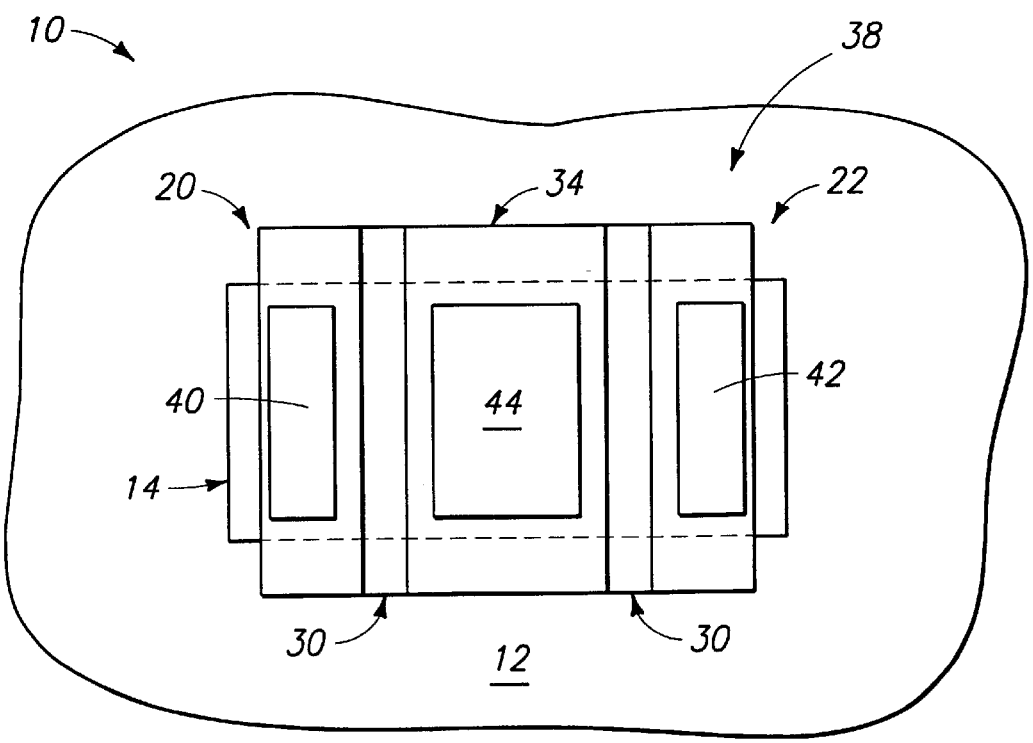
FIG. 11 is a plan view of the thin film field effect transistor shown in FIG. 10.
Figure 12:
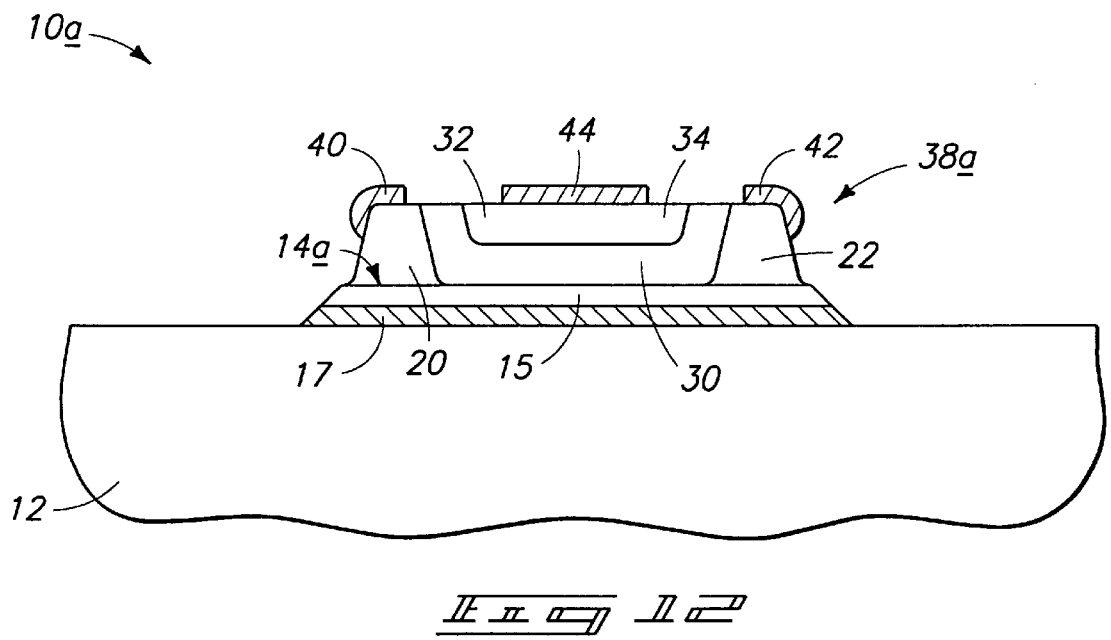
FIG. 12 is a cross-sectional view of a segment comprising an alternative thin film field effect transistor configuration.

Referring to FIG. 10 and FIG. 11, one configuration of a thin film field effect transistor 38 is shown. Thin film field effect transistor 38 formed upon segment 10 includes conductive material formed over gate 34 and source/drain regions 20, 22. The conductive material forms plural source/drain electrodes 40, 42 and a gate electrode 44. Electrodes 40, 42, 44 are utilized to provide electrical connection of respective components of thin film field effect transistor 38 with external circuitry (not illustrated). The conductive material comprises doped silicon or metal in exemplary embodiments.

Referring to FIG. 12, another configuration of a thin film field effect transistor is depicted wherein like reference numerals represent like components with any substantial differences indicated by suffix "a". The depicted segment 10a includes an alternative thin film field effect transistor configuration 38a. Thin film field effect transistor 38a of segment 10a includes a conductive layer 17 intermediate insulative substrate 12 and semiconductive layer 14a. Formation of conductive layer 17 provides channel bias of region 15. Semiconductive layer 14a has a reduced thickness compared with the semiconductive layer of previously described transistor configurations. Semiconductive layer 14a is provided over insulative substrate 12 and conductive layer 17. in so Conductive layer 17 is formed by chemical vapor deposition in one embodiment.

Figure 13:
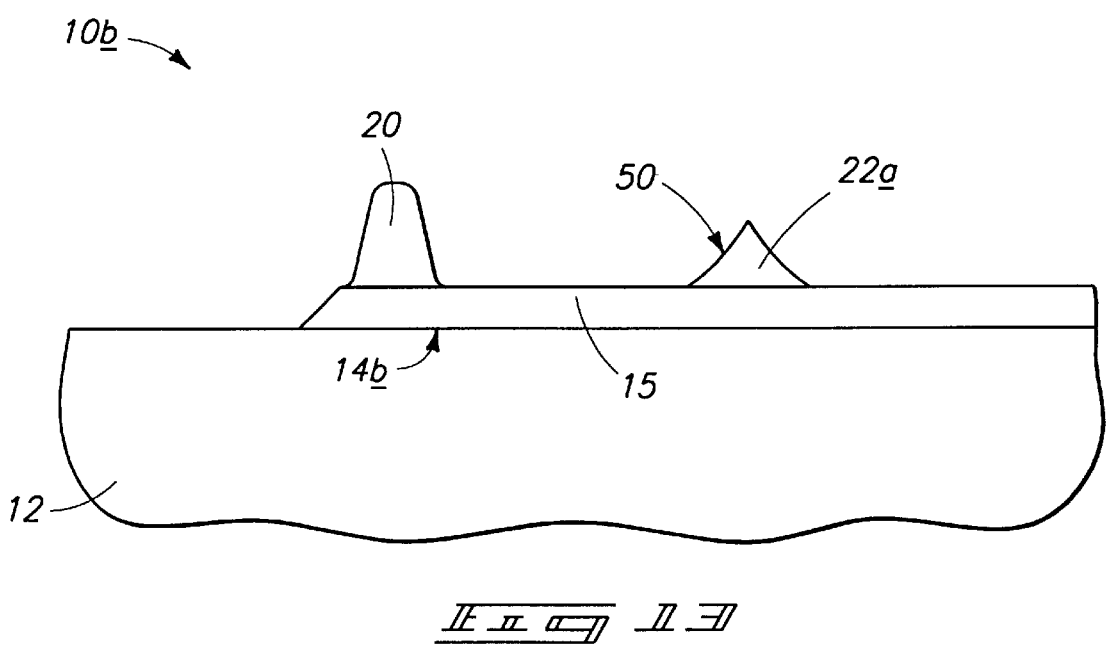
FIG. 13 is a cross-sectional view of a segment showing processing of a field emission device at a preliminary processing step.

Referring to FIG. 13, a segment 10b of a field emission apparatus is illustrated. Segment 10b of FIG. 13 depicts the field emission apparatus at an intermediate processing step corresponding to the processing step of segment 10 illustrated in FIG. 5 and FIG. 6.

Segment 10b includes a thin film semiconductive layer 14b having an increased lateral dimension over substrate 12.

One of source/drain regions 20, 22a over layer 14b is shaped to form a field emitter 50 in accordance with the presently described embodiment. As illustrated, source/drain region 22 is formed as field emitter 50. Source/drain region 20 comprises a mesa similar to the previously described thin film field effect transistor configurations. Source/drain region 20 could be formed to comprise a field emitter and region 22 could. be formed as a mesa in another embodiment.

Field emitter 50 can be formed utilizing a mask similar to the depicted mask 18 of FIG. 4 and having a reduced width. Utilization of a narrow mask provides source/drain region 22a with a point which projects outwardly from substrate 12 and thin film semiconductive layer 14b to form field emitter 50. One possible mask for fabricating field emitter 50 comprises a circular mask having a diameter of approximately 1 to 2 microns.

In accordance with one fabrication method, source/drain region 22a comprising field emitter 50 is formed by a combination of isotropic and anisotropic etching of semiconductive layer 16 in plasma which contains fluorinated gas, such as $NF_3$, in combination with a chlorinated gas, such as $Cl_2$, and helium. Such an etching process preferably provides field emitter 50 having an atomically sharp tip. Other fabrication techniques can also be utilized.

Figure 14:
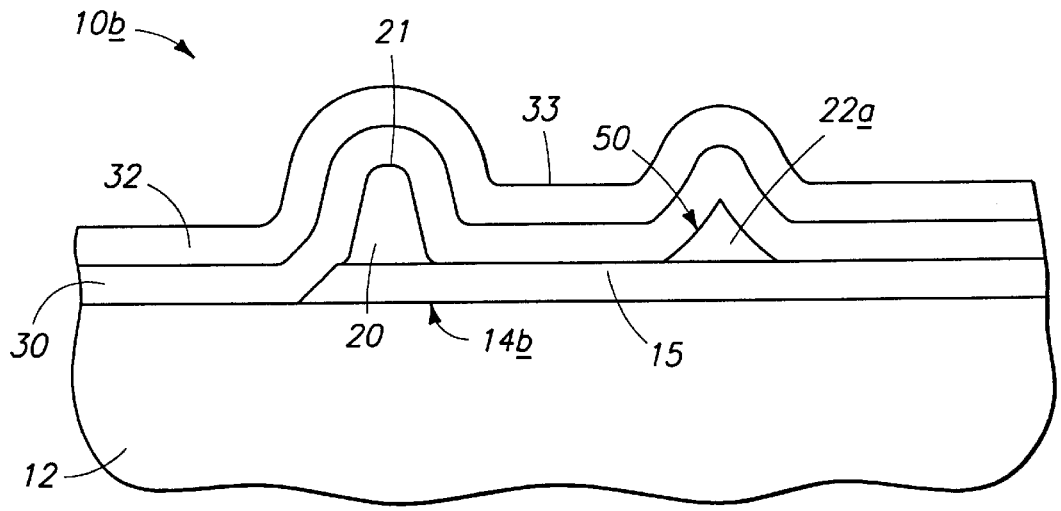
FIG. 14 is a cross-sectional view of the segment shown in FIG. 13 at a subsequent processing step.

Referring to FIG. 14, following formation of semiconductive region 22a as field emitter 50, processing of segment 10b occurs in a manner similar to the processing of the thin film field effect transistor previously described. For example, gate dielectric layer 30 and gate layer 32 are formed over semiconductive regions 20, 22a, substrate 12 and semiconductive layer 14b. The tip of field emitter 50 is preferably provided elevationally below the surface 33 of gate layer 32 and surface 21 of semiconductive region 20.

Figure 15:
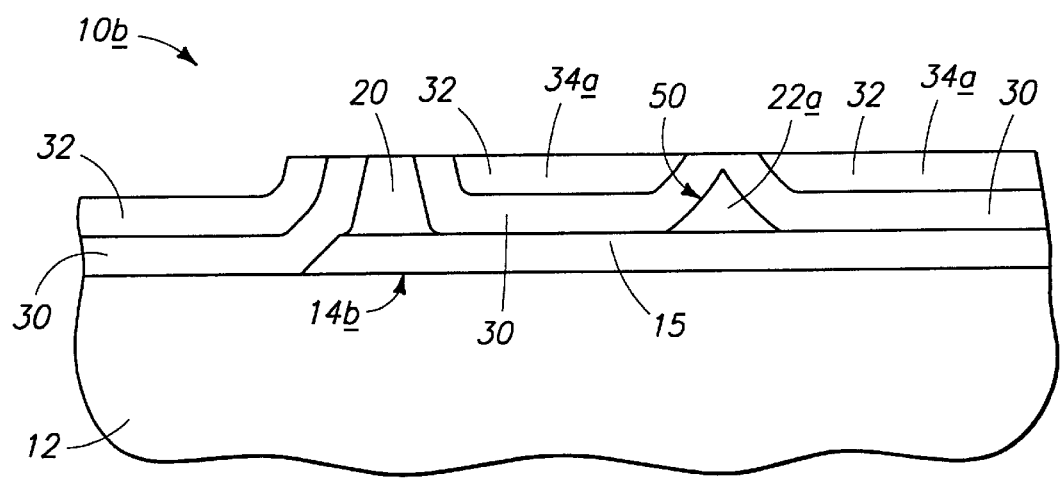
FIG. 15 is a cross-sectional view of the segment shown in FIG. 14 at a subsequent processing step.

Referring to FIG. 15, segment 10b has undergone polishing or other processing to remove portions of gate dielectric layer 30, gate layer 32 and semiconductive region 20. Such polishing comprises chemical-mechanical polishing in the described embodiment and ceases prior to any polishing of field emitter 50. As previously described, the removal of portions of layers 30, 32, and region 20 provides a gate 34a aligned with channel region 15 intermediate semiconductive regions 20, 22a.

Figure 16:
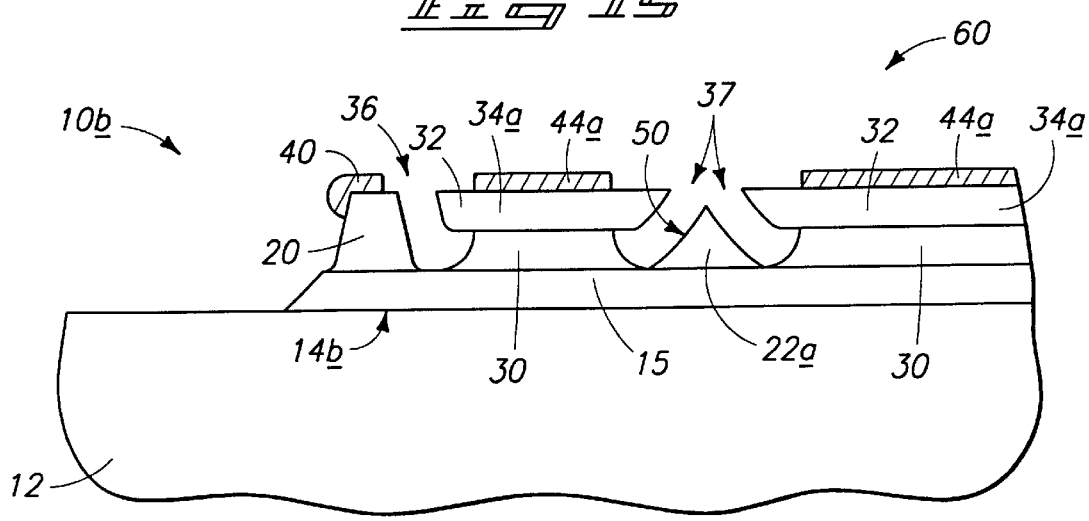
FIG. 16 is a cross-sectional view of the segment comprising a field emission device.

Referring to FIG. 16, segment 10b having a field emission apparatus 60 thereon is illustrated. Field emission apparatus 60 comprises a thin film transistor including field emitter 50.

Similar to the previously described embodiment, external portions of gate dielectric layer 30 and gate layer 32 are preferably removed following the polishing of segment 10b. However, only the lateral portions of layers 30, 32 adjacent and outwardly of semiconductive region 20 are removed in the preferred embodiment. The external lateral portions of layers 30, 32 adjacent the field emitter 50 are not removed according to one embodiment. More specifically, such lateral portions are utilized to provide an active field emission apparatus 60. The lateral portions provide a gate 34a about field emitter 50.

The depicted segment 10b also includes a conductive material comprising electrodes 40, 44a over selected portions of the depicted thin film field emission apparatus 60. The conductive material can comprise doped silicon or metal in exemplary embodiments. Electrodes 40, 44a are utilized to provide electrical connection with respective components of thin film field emission apparatus 60 with external circuitry (not illustrated). Such circuitry is configured in one embodiment to control the operation of field emission apparatus 60. Gate 34a is configured to control current flow intermediate semiconductive region 20 and semiconductive region 22a comprising field emitter 50 responsive to the selective application of a voltage potential via external circuitry (not shown) to gate 34a. Gate 34a also controls the emission of electrons from field emitter 50.

Cavity 36 is formed within gate dielectric layer 30 intermediate gate 34a and semiconductive region 20. Cavity 37 is formed within gate dielectric layer 30 adjacent field emitter 50. Cavities 36, 37 are formed by etching in the described embodiment. An etchant is preferably chosen to permit etching of gate dielectric layer 30 with minimal or no etching of gate layer 32 (i.e., selective to gate layer 32) as illustrated.

Referring to FIG. 17, a segment 10c having an alternative field emission apparatus 60a thereon is illustrated. Apparatus 60a includes plural emitters 50 as shown. Emitters 50 are formed using the techniques previously described. A gate 34b comprising material of layer 32 is provided about individual emitters 50 similar to the gate 34a of FIG. 16.

Electrodes 40, 44b comprising a conductive material such as doped silicon or metal are shown over portions of field emission apparatus 60a. Electrodes 40, 44b are coupled with external circuitry (not shown) configured to control the operation of apparatus 60a. Gate 34b is configured to control current flow intermediate region 20 and regions 22a comprising field emitters 50. As such, gate 34b controls the emission of electrons from field emitters 50.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A field effect transistor comprising:
   a semiconductive layer configured to form a channel region;
   a pair of spaced conductively doped semiconductive regions in electrical connection with the channel region of the semiconductive layer;
   a gate intermediate the semiconductive regions;
   a gate dielectric layer intermediate the semiconductive layer and the gate, the gate dielectric layer being configured to align the gate with the channel region of the semiconductive layer; and
   wherein the gate has an upper outermost surface, and the gate dielectric layer has an upper outermost surface substantially elevationally coincident with the gate upper outermost surface.

2. The field effect transistor according to claim 1 wherein the semiconductive layer comprises a thin film semiconductive layer.

3. The field effect transistor according to claim 1 wherein the gate dielectric layer has a uniform thickness.

4. The field effect transistor according to claim 1 wherein the semiconductive regions are formed over the semiconductive layer.

5. The field effect transistor according to claim 1 further comprising an insulative substrate, and the semiconductive layer is formed over the insulative substrate.

6. The field effect transistor according to claim 5 further comprising a conductive layer intermediate the insulative substrate and the semiconductive layer.

7. The field effect transistor according to claim 1 wherein the semiconductive regions individually have an upper outermost surface substantially elevationally coincident with the gate upper outermost surface.

8. A field effect transistor comprising:
   source and drain regions having a channel region positioned therebetween;
   a gate positioned operatively proximate the channel region, the gate having an upper outermost surface; and
   a gate dielectric layer received intermediate the channel region and the gate, the gate dielectric layer having an upper outermost surface substantially elevationally coincident with the gate upper outermost surface.

9. The field effect transistor according to claim 8 further comprising a thin film semiconductive layer intermediate the source and drain regions and configured to form the channel region.

10. The field effect transistor according to claim 9 wherein the source and drain regions are formed over the thin film semiconductive layer.

11. The field effect transistor according to claim 8 wherein the gate dielectric layer is configured to align the gate with the channel region.

12. A thin film transistor comprising:
   a thin film semiconductive layer;
   a pair of spaced conductively doped semiconductive regions in electrical connection with the thin film semiconductive layer;
   a self-aligned gate intermediate the semiconductive regions;
   a gate dielectric layer intermediate the thin film semiconductive layer and the gate; and
   wherein the gate has an upper outermost surface, and the gate dielectric layer has an upper outermost surface substantially elevationally coincident with the gate upper outermost surface.

* * * * *

UNITED STATES PATENT AND TRADEMARK OFFICE
CERTIFICATE OF CORRECTION

PATENT NO.     : 6,504,170 B1
DATED          : January 7, 2003
INVENTOR(S)    : J. Ung Lee et al.

It is certified that error appears in the above-identified patent and that said Letters Patent is hereby corrected as shown below:

Column 2,
Line 62, replace "promote the.progress of science and useful arts" (Article" with
-- promote the progress of science and useful arts" (Article --

Column 3,
Line 13, replace "of a thin film.field effect transistor is illustrated. Segment 10" with
-- of a thin film field effect transistor is illustrated. Segment 10 --
Line 14, replace "includes an insulative substrate 12 and. a semiconductive" with
-- includes an insulative substrate 12 and a semiconductive --

Column 6,
Line 1, replace "layer 17. in so Conductive layer 17 is formed by chemical" with
-- layer 17. Conductive layer 17 is formed by chemical --

Signed and Sealed this

Fifth Day of August, 2003

JAMES E. ROGAN
*Director of the United States Patent and Trademark Office*